United States Patent [19]
Lim et al.

[11] Patent Number: 5,926,691
[45] Date of Patent: Jul. 20, 1999

[54] METHODS OF FABRICATING BOROPHOSPHOSILICATE GLASS (BPSG) FILMS HAVING IMPURITY CONCENTRATIONS WHICH REMAIN STABLE OVER TIME, AND FOR USING SUCH FILMS TESTING OF MICROELECTRONIC DEVICES

[75] Inventors: Kyu-hong Lim, Taejon; Bong-su Kim, Kyungki-do, both of Rep. of Korea

[73] Assignee: Samsung Electronics Co., Ltd., Rep. of Korea

[21] Appl. No.: 08/846,083

[22] Filed: Apr. 25, 1997

[30] Foreign Application Priority Data

Jul. 24, 1996 [KR] Rep. of Korea ............ 96-29965

[51] Int. Cl.$^6$ .................. G01R 31/26; H01L 21/66; H01L 21/31; H01L 21/469
[52] U.S. Cl. .................. 438/18; 438/763; 438/787
[58] Field of Search ............. 438/759, 763, 438/781, 787, 791, 10, 11, 17, 18

[56] References Cited

U.S. PATENT DOCUMENTS

| | | | |
|---|---|---|---|
| 5,286,681 | 2/1994 | Maeda et al. | 437/240 |
| 5,296,745 | 3/1994 | Shirai et al. | 257/786 |
| 5,336,640 | 8/1994 | Sato | 437/240 |
| 5,405,800 | 4/1995 | Ogawa et al. | 437/228 |
| 5,679,475 | 10/1997 | Yamagata et al. | 428/698 |
| 5,786,638 | 7/1998 | Yamaha | 257/760 |
| 5,804,515 | 9/1998 | Park | 438/700 |

*Primary Examiner*—Brian Dutton
*Attorney, Agent, or Firm*—Myers Bigel Sibley & Sajovec

[57] ABSTRACT

Borophosphosilicate glass (BPSG) films having impurity concentrations which remain stable over time are fabricated by removing moisture from a BPSG film and forming a shield film on the BPSG film to reduce reintroduction of moisture into the BPSG film. Moisture is removed from the BPSG film by annealing the BPSG film. The BPSG film may be used to test impurity concentrations in BPSG films of microelectronic devices. The BPSG films may also be used in the manufacture of microelectronic devices.

9 Claims, 2 Drawing Sheets

METHODS OF FABRICATING BOROPHOSPHOSILICATE GLASS (BPSG) FILMS HAVING IMPURITY CONCENTRATIONS WHICH REMAIN STABLE OVER TIME, AND FOR USING SUCH FILMS TESTING OF MICROELECTRONIC DEVICES

FIELD OF THE INVENTION

This invention relates to microelectronic devices and fabrication and testing methods therefor, and more particularly to borophosphosilicate glass (BPSG) films for microelectronic devices and fabricating and testing methods therefor.

BACKGROUND OF THE INVENTION

Borophosphosilicate glass (BPSG) films are widely used in microelectronic devices. For example, BPSG films may be used as a planarization film for a microelectronic circuit which provides good step coverage for high density microelectronic devices.

In fabricating BPSG films, it is well known that the amount of flow of the BPSG film varies with film composition, flow temperature, flow time and flow atmosphere. For example, the flow temperature is lowered by 40° C. when the boron concentration increases approximately by one weight percent in the BPSG film. Accordingly, in the fabrication of microelectronic devices including BPSG films, it is known to control the concentration of impurities such as boron or phosphorus in BPSG films so that the BPSG flows by the proper amount at the intended flow temperature.

In order to measure the impurity concentration in the BPSG film, the BPSG film is generally monitored using a measuring instrument which uses X-rays, infrared rays, or other techniques to monitor the fabrication process of microelectronic devices. However, the measuring instrument generally requires a reference sample for comparison purposes in order to verify that the fabricated BPSG film has the requisite impurity concentration. In order to provide uniform impurity concentrations over time during microelectronic device fabrication, the reference sample BPSG film should preferably have impurity concentrations which remain stable over time.

Unfortunately, in a conventional BPSG reference sample, concentration of impurities such as boron and phosphorus may change over time as the impurities react with internal or external moisture. FIGS. 1A and 1B graphically illustrate the decrease in boron and phosphorus concentrations, respectively, over time. As a result of these decreasing concentrations, it is difficult to maintain a predetermined impurity concentration in BPSG films which are fabricated in microelectronic devices.

Changes in impurity concentrations in BPSG films may occur as follows. Initial changes in impurity concentrations may occur as the impurities in the BPSG films are diluted with moisture which is contained in the BPSG film when the BPSG film is initially fabricated on a substrate. Moreover, after the BPSG film is deposited, the impurity concentration of the BPSG film may be diluted as a result of interaction with moisture external to the BPSG film. This may result in secondary impurity concentration changes.

In view of the above changes in impurity concentrations of reference sample BPSG films, it may be difficult to measure the impurity concentrations in BPSG films of microelectronic devices during fabrication thereof.

SUMMARY OF THE INVENTION

It is therefore an object of the present invention to provide methods of fabricating borophosphosilicate glass (BPSG) films having impurity concentrations which remain stable over time.

It is another object of the present invention to provide methods of testing impurity concentrations in BPSG films of microelectronic devices using a reference sample BPSG film having impurity concentrations which remain stable over time.

It is still another object of the present invention to provide reference sample BPSG films having impurity concentrations which remain stable over time.

It is yet another object of the present invention to provide BPSG films having impurity concentrations which remain stable over time.

These and other objects are provided, according to the present invention, by methods of fabricating a BPSG film by removing moisture from the BPSG film and forming a shield film on the BPSG film to reduce reintroduction of moisture into the BPSG film. Accordingly, impurity concentrations in the BPSG film can remain stable over time.

Preferably, moisture is removed from the BPSG film by annealing the BPSG film. Annealing may be performed at temperatures between 650° C. and 750° C. for between 20 and 30 minutes. Annealing may also be performed in a nitrogen atmosphere.

The BPSG film is preferably formed on a substrate and the shield film is preferably formed on the BPSG film, opposite the substrate. The shield film preferably is a nitride shield film or an oxide shield film. The oxide shield film may be formed using plasma deposition.

According to the present invention, impurity concentrations in BPSG films of microelectronic devices may be accurately tested by fabricating a reference sample BPSG film having a predetermined impurity concentration. Moisture is then removed from the reference sample BPSG film. A shield film is then formed on the reference sample BPSG film to reduce reintroduction of moisture into the reference sample BPSG film, to thereby provide a reference sample BPSG film wherein the predetermined impurity concentration remains stable over time. The reference sample BPSG film is then used to test impurity concentrations in BPSG films of microelectronic devices.

Accordingly, BPSG films having impurity concentrations which remain stable over time, according to the present invention, comprise a moisture-free BPSG film and a shield film on the moisture-free BPSG film which reduces reintroduction of moisture into the moisture-free BPSG film. Accordingly, the BPSG film may be used in the fabrication of microelectronic devices and may also be used to provide a reference sample BPSG film which is used for testing impurity concentrations in BPSG films of microelectronic devices. Preferably, the moisture-free reference sample BPSG film is provided on a substrate. Stable BPSG films may thereby be provided for manufacturing and testing purposes.

DETAILED DESCRIPTION OF PREFERRED EMBODIMENTS

Figure 1A:
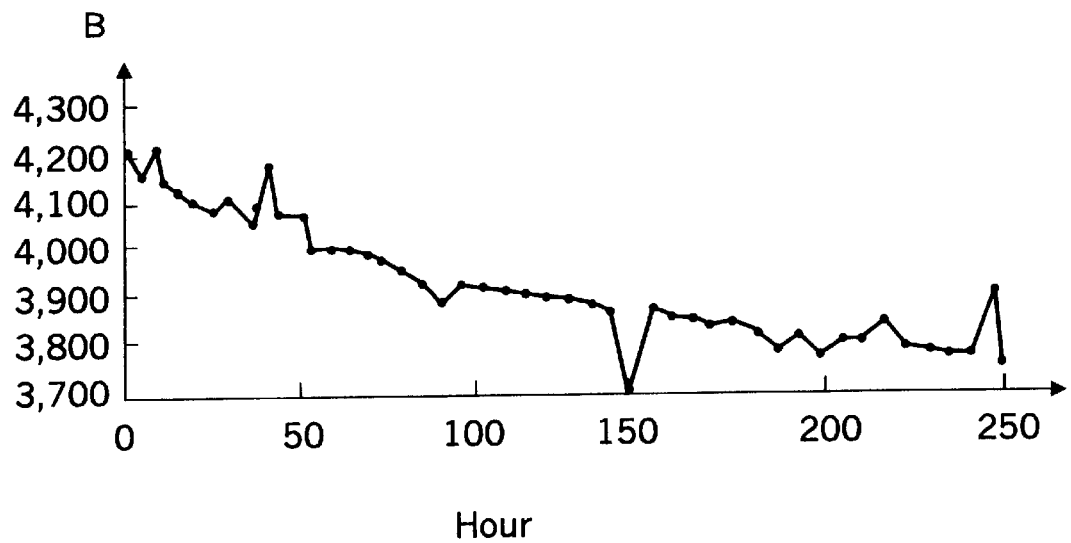
FIG. 1A graphically illustrates boron concentration change over time in a conventional BPSG film reference sample.
Figure 1B:
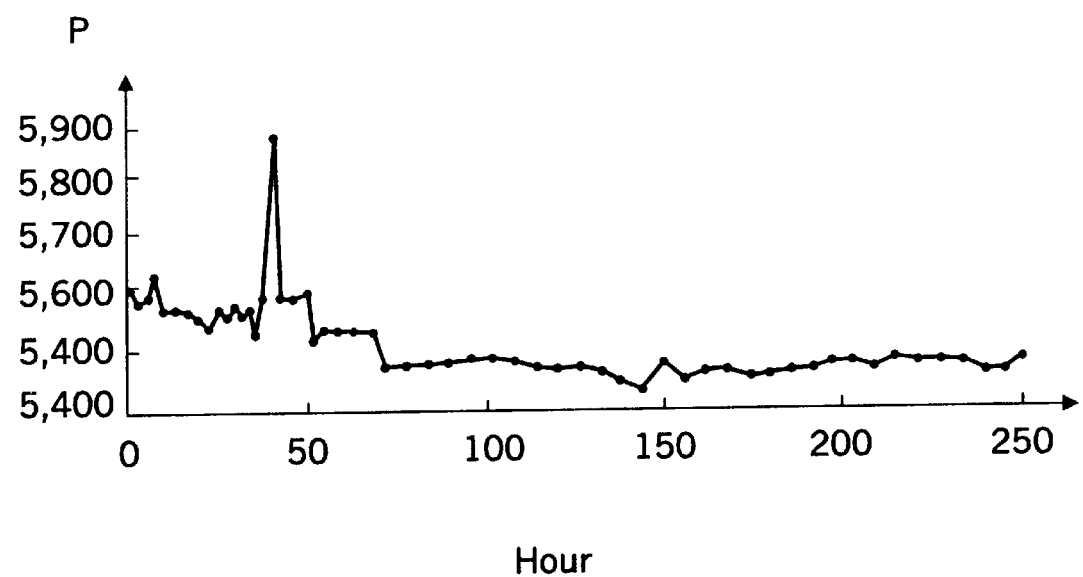
FIG. 1B graphically illustrates phosphorus concentration change over time in a conventional BPSG film reference sample.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout.

Figure 2A:
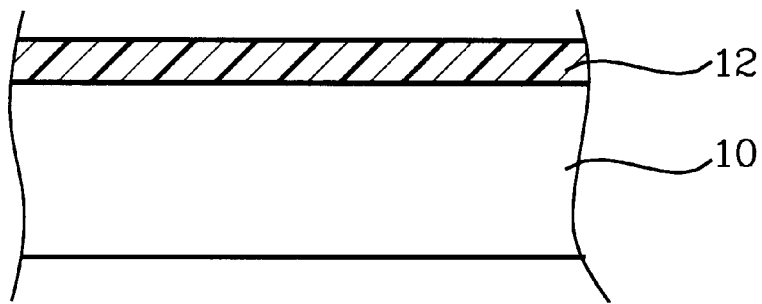
FIGS. 2A and 2B are cross-sectional views illustrating methods of fabricating BPSG films according to the present invention.
Figure 2B:
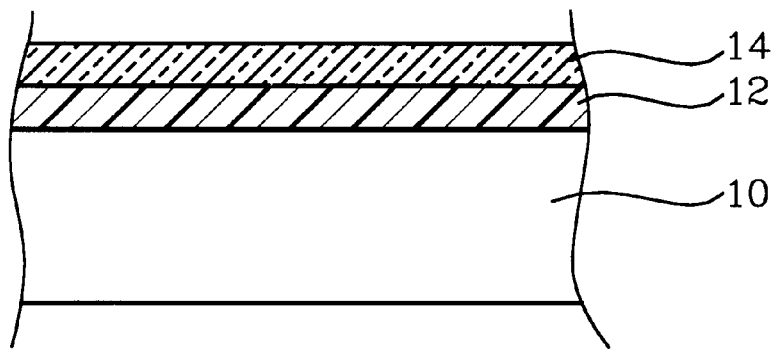

Referring now to FIGS. 2A and 2B, methods of fabricating BPSG films including reference sample BPSG films having impurity concentrations which remain stable over time, according to the invention, will now be described. According to the invention, the resistance of a BPSG film to moisture is improved.

More particularly, moisture is removed from the BPSG film. A shield film is then formed on the BPSG film to reduce and preferably prevent reintroduction of moisture into the BPSG film.

Referring now to FIG. 2A, a BPSG film 12 including predetermined concentrations of boron and phosphorus impurities is formed on a substrate 10. Substrate 10 may be a silicon or other substrate and BPSG film may be formed by deposition or other conventional techniques. A slight amount of moisture is generally contained in the BPSG film 12. The moisture reacts with impurities such as boron and phosphorus.

In order to prevent such a reaction, moisture is removed from the BPSG film, for example by annealing. Annealing temperatures of between 650° C. and 750° C. and preferably at 700° C., and annealing times of between 20 and 30 minutes are preferably used. A nitrogen atmosphere is also preferably used.

It will be understood by those having skill in the art that the time and temperature should be controlled to remove moisture from the BPSG film without damaging the film 12 or substrate 10. Thus, if the BPSG film 12 is annealed at too high a temperature or for too long a time, the silicon substrate 10 may be adversely changed. This change in the silicon substrate may cause a problem when measuring impurity concentration using an infrared spectrum. Conversely, if annealing of BPSG film 12 is performed at too low a temperature, the internal moisture contained in the BPSG film may not be completely removed.

Accordingly, it is preferable to perform annealing at a temperature of about 700° C. for about 20–30 minutes. Under these conditions, internal moisture of the BPSG film 12 may be completely removed by evaporation, to produce a moisture-free BPSG film.

Referring now to FIG. 2B, after the moisture in the BPSG film is removed, a shield film 14 is preferably formed on the BPSG film to reduce and preferably prevent external moisture from being reintroduced into the BPSG film. A nitride film or an oxide film which is deposited using plasma deposition may be deposited as shield film 14.

The thickness of shield film 14 is preferably between about 1000Å and about 4000Å. The thickness may vary depending upon the particular process involved, and by taking into account the shielding effect on moisture.

By depositing shield film on BPSG film 12, external moisture is shielded and is preferably not reintroduced into the BPSG film 12. Since the BPSG film does not come into contact with moisture and since moisture has been removed from the BPSG film, the concentration of boron and phosphorus impurities in the BPSG film may remain stable over time.

Thus, even though time passes by, the BPSG film 12 maintains a constant concentration. Accordingly, in manufacturing microelectronic devices including BPSG films, the moisture-free reference sample BPSG film maintains a constant impurity concentration. The measuring instrument therefore can have a calibrated and stable reference. The stable reference may be used to stably measure and control the flow of the BPSG during manufacture of microelectronic devices. The step coverage of the BPSG film on the microelectronic devices can thereby be improved. Since the BPSG film reference sample is stable over time, the measuring equipment may be easy to maintain and calibrate.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:

1. A method of fabricating a borophosphosilicate glass (BPSG) film having impurity concentrations which remain stable over time, comprising the steps of:

removing moisture from the BPSG film by annealing the BPSG film at temperatures between 650° C. and 750° C. for between 20 and 30 minutes; and forming a shield film on the BPSG film to reduce reintroduction of moisture into the BPSG film.

2. A method according to claim 1 wherein the annealing step is performed in a nitrogen atmosphere.

3. A method according to claim 1 wherein the BPSG film is on a substrate, and wherein the forming step comprises the step of forming a shield film on the BPSG film, opposite the substrate, to reduce reintroduction of moisture into the BPSG film.

4. A method according to claim 1 wherein the forming step comprises the step of forming a nitride shield film on the BPSG film to reduce reintroduction of moisture into the BPSG film.

5. A method according to claim 1 wherein the forming step comprises the step of forming an oxide shield film on the BPSG film to reduce reintroduction of moisture into the BPSG film.

6. A method according to claim 5 wherein the forming step comprises the step of plasma depositing an oxide shield film on the BPSG film to reduce reintroduction of moisture into the BPSG film.

7. A method of testing impurity concentrations in borophosphosilicate glass (BPSG) films of microelectronic devices, comprising the steps of:

fabricating a reference sample BPSG film that is separate from the microelectronic devices, the reference sample BPSG film having an impurity concentration;

removing moisture from the reference sample BPSG film;

forming a shield film on the reference sample BPSG film to reduce reintroduction of moisture into the reference sample BPSG film, to thereby provide a reference sample BPSG film wherein the impurity concentration does not increase substantially over time; and using the reference sample BPSG film wherein the impurity concentration does not increase substantially over time to test impurity concentrations in BPSG films of the microelectronic devices that are separate from the reference sample BPSG film.

8. A method according to claim 7 wherein the removing step comprises the step of annealing the reference sample BPSG film.

9. A method according to claim 7 wherein the reference sample BPSG film is on a substrate, and wherein the forming step comprises the step of forming a shield film on the reference sample BPSG film, opposite the substrate, to reduce reintroduction of moisture into the reference sample BPSG film.

* * * * *